(12) United States Patent
Kim et al.

(10) Patent No.: US 6,806,517 B2
(45) Date of Patent: Oct. 19, 2004

(54) FLASH MEMORY HAVING LOCAL SONOS STRUCTURE USING NOTCHED GATE AND MANUFACTURING METHOD THEREOF

(75) Inventors: Sang Su Kim, Suwon (KR); Nae-In Lee, Seoul (KR); Geum-Jong Bae, Suwon (KR); Ki Chul Kim, Suwon (KR); Hwa Sung Rhee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/388,427

(22) Filed: Mar. 17, 2003

(65) Prior Publication Data

US 2004/0183106 A1 Sep. 23, 2004

(51) Int. Cl.[7] ............................................. H01L 27/10
(52) U.S. Cl. ...................... 257/204; 257/239; 257/261; 257/315; 257/316; 257/324; 438/201; 438/211; 438/257; 438/593
(58) Field of Search .................... 257/204, 239, 257/261, 298, 315–326; 438/201, 211, 216, 241, 257, 258, 260–266, 591, 593

(56) References Cited

U.S. PATENT DOCUMENTS

| | | | |
|---|---|---|---|
| 5,067,108 A | 11/1991 | Jenq | |
| 5,467,308 A | 11/1995 | Change et al. | |
| 5,559,049 A * | 9/1996 | Cho | ............................ 438/304 |
| 6,011,725 A | 1/2000 | Eitan | |
| 6,388,293 B1 | 5/2002 | Ogura et al. | |
| 6,399,469 B1 * | 6/2002 | Yu | .............................. 438/595 |
| 6,437,377 B1 | 8/2002 | Ajmera et al. | |
| 6,461,904 B1 | 10/2002 | Jin et al. | |
| 6,506,649 B2 | 1/2003 | Fung et al. | |
| 6,509,219 B2 | 1/2003 | Tsou et al. | |
| 6,528,363 B2 | 3/2003 | Ku et al. | |
| 6,541,320 B2 | 4/2003 | Brown et al. | |
| 6,551,941 B2 | 4/2003 | Yang et al. | |
| 6,580,136 B2 | 6/2003 | Mandelman et al. | |
| 6,645,840 B2 * | 11/2003 | Grider et al. | ................ 438/592 |
| 2002/0142523 A1 * | 10/2002 | Ryu et al. | .................... 438/149 |

FOREIGN PATENT DOCUMENTS

WO          0034984          6/2000

OTHER PUBLICATIONS

"Dry Etching for ULSI Fabrication"; pp. 686–688.
Johnson et al. "Selective Chemical Etching of Polycrystalline Sige Alloys with Respect to Si and $SiO_2$"; Department of Electrical and Computer Engineering; © 1992; pp. 805–810.
Skotnicki et al.; "Well–Controlled, Selectively Under–Etched Si/SiGe Gates for RF and High Performance CMOS"; ST. Microelectronics; © 2000 IEEE; pp. 156–157.
Pidin et al.; "A Notched Metal Gate MOSFET for Sub–0.1 $\mu$m Operation"; Fujitsu Laboratories Ltd.; (2) 2000 IEEE; pp. 659–661.

* cited by examiner

*Primary Examiner*—David Nelms
*Assistant Examiner*—Andy Huynh
(74) *Attorney, Agent, or Firm*—Harness Dickey (57) ABSTRACT

A notched gate SONOS transistor includes: a substrate having source/drain regions; a gate insulator layer on the substrate between the source/drain regions; a notched gate structure, on the gate insulator leyer, having at least one notch; and at least one ONO wedge structure in the at least one notch, respectively, of the gate structure.

20 Claims, 12 Drawing Sheets

FLASH MEMORY HAVING LOCAL SONOS STRUCTURE USING NOTCHED GATE AND MANUFACTURING METHOD THEREOF

DESCRIPTION OF THE BACKGROUND ART

In general, semiconductor memory devices for storing data are divided into volatile memory devices, which are likely to lose their data when the power supply is interrupted, and nonvolatile memory devices, which can retain their data even when the power supply is interrupted. Compared to other nonvolatile memory technologies, e.g., disk drives, nonvolatile semiconductor memories are relatively small. Accordingly, nonvolatile memory devices have been widely employed in mobile telecommunications systems, memory cards, etc.

Recently, nonvolatile memory devices having silicon-oxide-nitride-oxide-silicon (SONOS) structures, e.g., SONOS-type nonvolatile memory devices, have been proposed. The SONOS-type nonvolatile memory devices have thin cells which are simple to manufacture and can be easily incorporated, e.g., into a peripheral region and/or a logic region of an integrated circuit.

A SONOS-type nonvolatile semiconductor memory device according to the Background Art will be described with reference to FIG. 1. The SONOS-type nonvolatile semiconductor memory device 10 includes: a silicon substrate 5 having doped source and drain regions 5; a tunnel oxide layer 1; a nitride layer 2 on the tunnel oxide layer 1; a top oxide layer 3 on the nitride layer 2; and a polycrystalline silicon (polysilicon) gate layer 4 on the top oxide layer 3. Together the layers 1, 2 and 3 define an oxide-nitride-oxide (ONO) structure 1/2/3.

In operation, electrons or holes are injected into the tunnel oxide layer 1 from the inversion region induced between the source 5 and drain 5. The nitride layer 2 is a charge trapping layer that traps electrons or holes that penetrate through the tunnel oxide layer 1. The top oxide layer 3 is provided to prevent any electrons or holes that escape the trapping layer 2 from reaching the polycrystalline silicon layer 4 during write or erase operations. The structure 10 can be described as a stacked SONOS-type cell.

When the gate electrode 4 is positively charged, electrons from the semiconductor substrate 6 become trapped in a region 7 of the nitride layer 2. Conversely, when the gate electrode 4 is negatively charged, holes from the semiconductor substrate 6 become trapped in the region 7. The depiction of the region 7 in FIG. 1 is asymmetric with respect to a vertical center line (not depicted) of the SONOS-type semiconductor memory device 10. FIG. 1 assumes a situation in which the drain corresponds to the region 5 at the right side of FIG. 1 while the source corresponds to the region 5 at the left side of FIG. 1, with the drain also assumed to be biased at a higher voltage than the source. Accordingly, electrons/holes accumulate near the higher-biased drain.

The electrons or the holes trapped in the region 7 can change the threshold voltage of the entire nonvolatile semiconductor memory device. When the gate threshold voltage reaches a predetermined level, i.e., when the current of a channel is reduced to a sufficiently low level, the programming process stops. The threshold voltage Vth is set to a value at which a bit '0' can be distinguished consistently from a bit '1' for data that has been retained a predetermined amount of time (rephrasing, Vth is set to a value at which a predetermined amount of data retention time can be achieved consistently).

Since an ONO structure (1/2/3) exists above the entire channel region, the stacked SONOS-type cell 10 has a high initial threshold voltage Vth (and corresponding high power consumption) and a high program current. Because of the high threshold voltage Vth, it is difficult to merge (or integrate) on one chip both the stacked SONOS-type cell and general logic product having a low initial threshold voltage Vth.

In addition, in the stacked SONOS-type cell 10, electrons trapped in the nitride layer 2 can move laterally along the nitride layer, and thus an erase operation may not be completely performed. If programming operations and erase operations are repetitively performed, the initial threshold voltage Vth can increase, which can reduce the data retention time.

Figure 2:
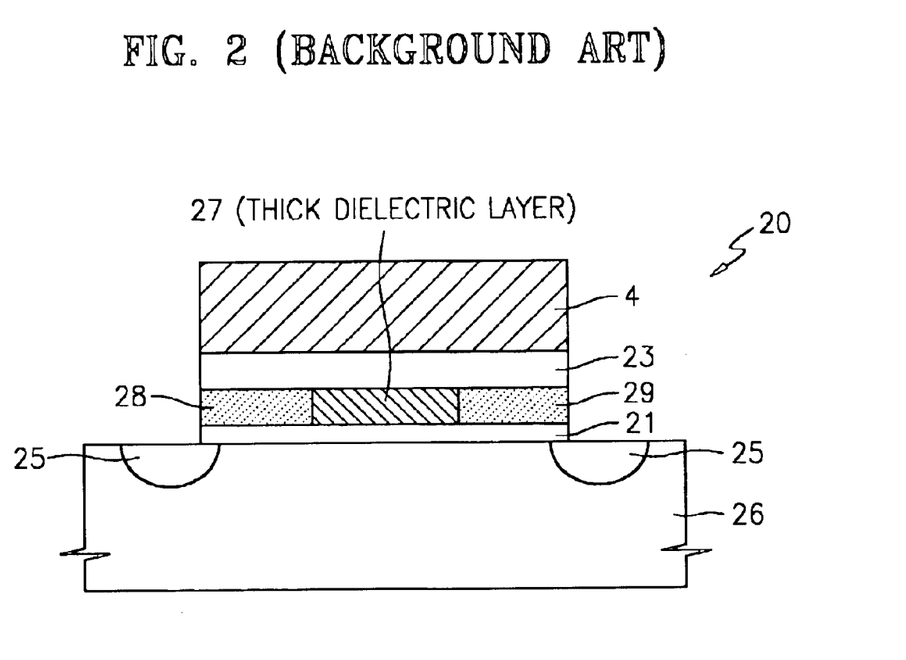
FIG. 2 is a cross-section of another local SONOS-type nonvolatile memory according to the Background Art.

To address such problems, SONOS-type devices having various structures have been developed in the Background Art, e.g., the local SONOS-type cell 20 shown in FIG. 2. The SONOS-type cell 20 includes: a silicon substrate 26 having doped source and drain regions 25; a tunnel oxide layer 21 on the substrate 26; nitride layer segments 28 and 29 on the tunnel oxide layer 21; a dielectric layer 27 on the tunnel oxide layer 21; a top oxide layer 23 on the nitride layer segment 28, the dielectric layer 27 and the nitride layer segment 29; and a polycrystalline silicon gate layer 4 on the top oxide layer 23.

Figure 1:
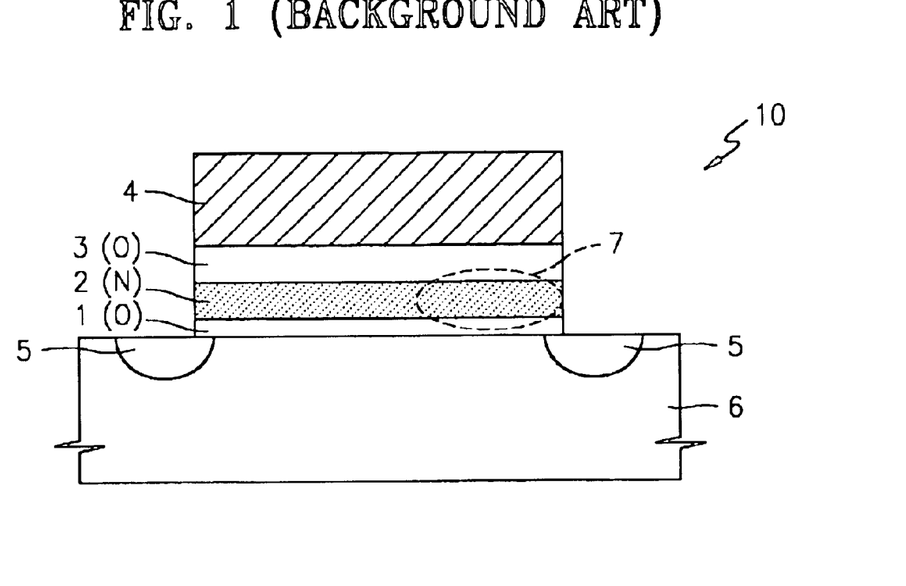
FIG. 1 is a cross-section of a SONOS-type nonvolatile memory according to the Background Art.

In contrast to FIG. 1, where the tunnel oxide layer 2 entirely covers the channel region between the source and drain regions 5 the nitride layer (not depicted, but from which the nitride layer segments 28 and 29 were formed) has had a center section removed, resulting in the nitride layer segments 8 and 9. By separating the nitride layer segments 28 and 29 (and filling the resulting gap with the dielectric layer 27), trapped electrons that would otherwise be able to migrate laterally along the nitride layer 2 of FIG. 1 are prevented from moving from the nitride layer segment 28 to the nitride layer segment 29 and vice versa. This improves the data retention time of the SONOS-type cell 20 relative to the SONOS-type cell 10. The separated ONO structures 21/(28 or 29)/23 are the reason for describing the SONOS-type cell 20 as a local SONOS-type cell. However, because a thick dielectric structure (layers 27 and 23) exists above the entire channel region (especially in the portion over which lies the layer 27), the local SONOS-type cell 20 still has a high initial threshold voltage Vth.

Figure 3:
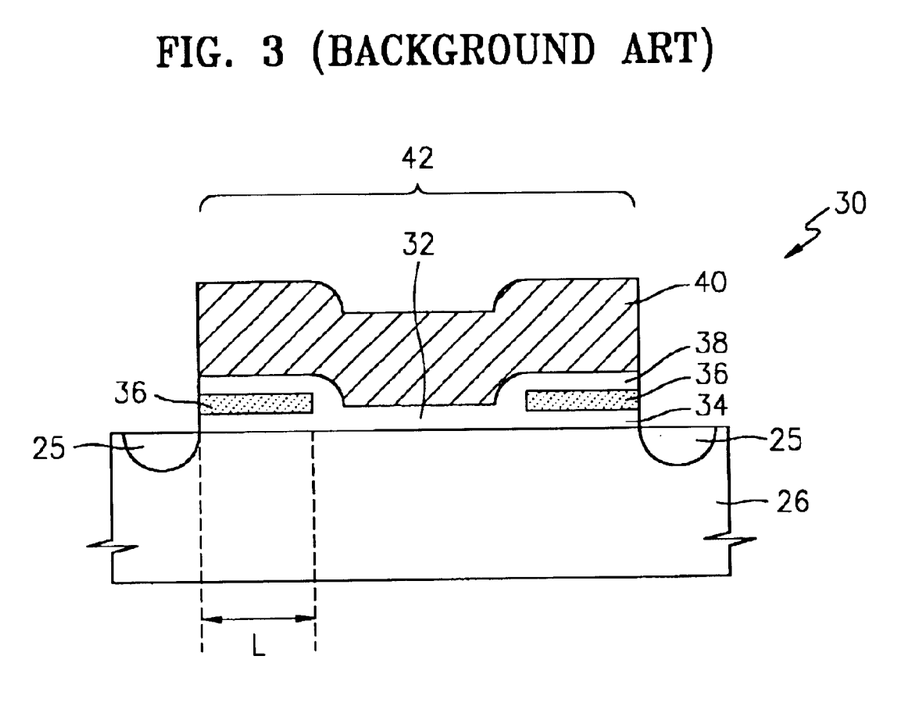
FIG. 3 is a cross-section of yet another local SONOS-type nonvolatile memory according to the Background Art.

FIG. 3 is a diagram showing another local SONOS-type cell 30 according to Background Art. The local SONOS-type cell 30 includes: a silicon substrate 26 having doped source and drain regions 25; an oxide layer 32 on the substrate 26, the oxide layer 32 having branches 34 and 38; nitride layer segments 36 formed between pairs of oxide layer branches 34 and 38, respectively; and a polycrystalline silicon gate layer 40. Each nitride layer segment 36 sandwiched between oxide branches 34 and 38 defines an ONO structure 34/36/38. The portion of the oxide layer 32 between the ONO structures is significantly thinner than the corresponding dielectric structure 27/23 in the local SONOS-type cell 20 of FIG. 2, which can improve (namely, lower) the threshold voltage Vth.

The operating characteristics of the local SONOS-type cell 30 can vary considerably depending on the length (L) of the overlap between the ONO structure 34/36/38 and the gate layer 40, where L is substantially the same as the length of the nitride layer segment 36. Accordingly, it is important to minimize variation in the length of the overlap between the ONO structures 34/36/38 and the gate 40.

Photolithography is used to define the length of the ONO structures 34/36/38 in FIG. 3. During the photography portion of the photolithography process, misalignment can occur, resulting in significant overlap variation.

Figure 4A:
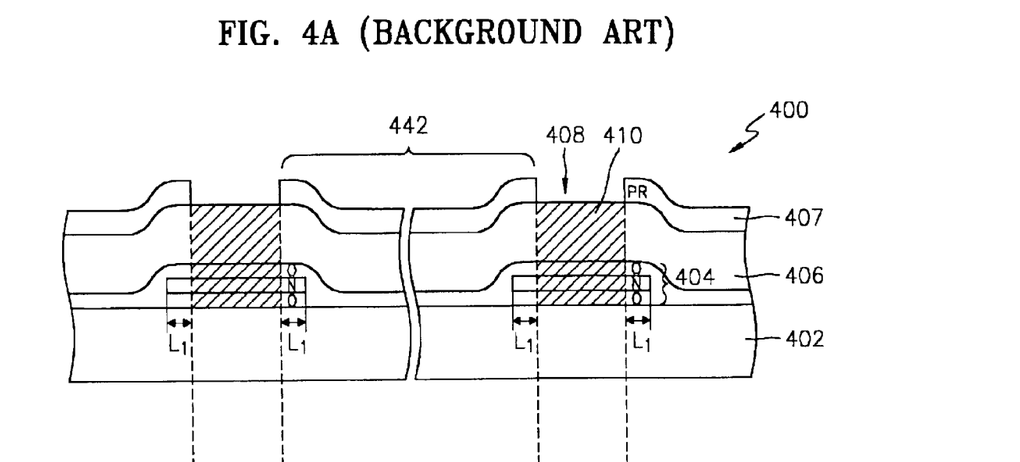
FIGS. 4A and 4B are cross-sections of intermediate structures according to the Background Art formed during the fabrication of the local SONOS-type structure of FIG. 3.
Figure 4B:
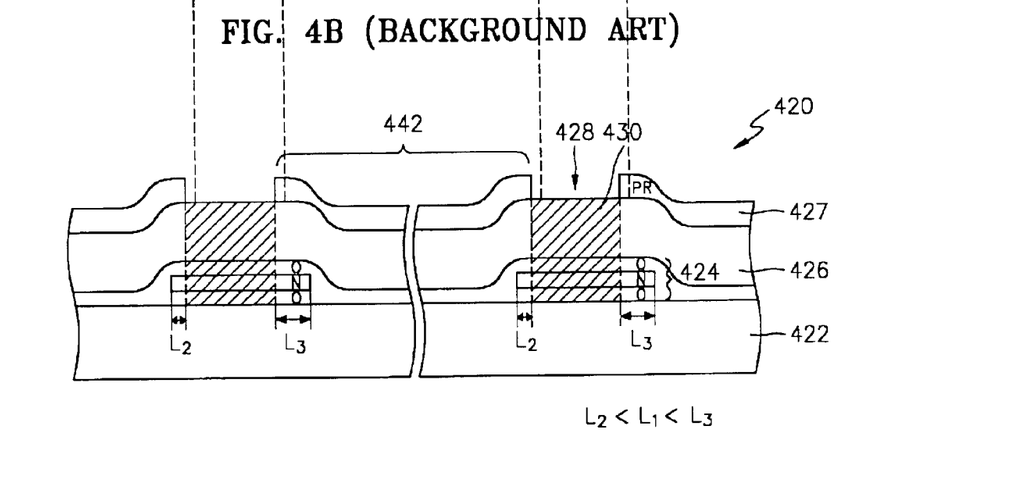

To help depict the misalignment problem, FIGS. 4A and 4B are provided. FIG. 4A is a cross-section (of an intermediate structure produced at one stage in the manufacture of the SONOS-type cell 30 in FIG. 3) showing substantial alignment. FIG. 4B is a similar cross-section showing significant misalignment. To help convey the relationship between FIG. 3 and FIGS. 4A and 4B, regarding the arrangement of lays in FIG. 3 underneath the bracket 42, a corresponding arrangement of layers in FIG. 4 is located underneath bracket 442.

The intermediate structure 400 in FIG. 4A includes: a silicon semiconductor substrate 402; an ONO structure 404 on the substrate 402; a polycrystalline silicon layer 406 on the ONO structure 404 and on the substrate 402; and a photoresist (PR) 407 on the polycrystalline silicon gate layer 406. A gap 408 is depicted in the photoresist layer 407. The gap 408 is aligned so that when the underlying cross-hatched 410 is removed, the resulting overlap between the remaining ONO structures 404 and the gate layer 406 is substantially equal, as indicated by each overlap having the length $L_1$.

FIG. 4B, in contrast, is a cross-section of an intermediate structure 420 according to the Background Art that corresponds to the intermediate structure 400, albeit suffering significant misalignment. The intermediate structure 420 includes: a silicon substrate 422; an ONO structure 424 on the substrate 422; a polycrystalline layer 426 on the ONO structure 424 and the substrate 422; and a photoresist layer 427 having in it gaps 428. When the cross-hatched areas 430 underneath the gaps 428 are removed via etching, the resulting ONO structures 424 will not be of the same width, as indicated by the lengths $L_2$ and $L_3$, where $L_2 < L_1 < L_3$. As an example, where $L_1 = 150$ nm, significant misalignment can produce lengths of about $L_2 = 100$ nm and $L_3 = 200$ nm. Such variation in the overlap lengths causes variation in the threshold voltages to be exhibited by the local SONOS-type cells, e.g., depending upon whether the cell has overlap $L_2$ or $L_3$.

SUMMARY OF THE INVENTION

An embodiment of the invention provides a notched gate SONOS transistor comprising: a substrate having source/drain regions; a gate insulator layer on the substrate between the source/drain regions; a notched gate structure, on the gate insulator layer, having at least one notch; and al least one ONO wedge structure in the at least one notch, respectively, of the gate structure.

Another embodiment of the invention provides a method of making a notched gate arrangement for a SONOS transistor, the method comprising: providing a substrate; forming a gate insulator layer on the substrate; forming a notched gate structure, on the gate insulator layer, having at least one notch; and forming at least one ONO wedge structure in the at least one notch, respectively, of the gate structure.

Additional features and advantages of the invention will be more fully apparent from the following detailed description of example embodiments, the appended claims and the accompanying drawings.

DETAILED DESCRIPTION OF EXAMPLE EMBODIMENTS

An embodiment of the present invention provides a local SONOS-type structure, e.g., a cell for nonvolatile semiconductor memory, which can solve the above and other problems of the local SONOS-type cells according to the Background Art. This embodiment can exhibit (1) a reduced initial threshold voltage Vth and/or (2) an increased number of programming operations and erase operations for which a predetermined data retention time can be maintained, relative to the Background Art.

An embodiment of the invention provides a method of forming a local SONOS-type structure having a notched gate electrode.

An embodiment of the invention represents the recognition of a flaw in a rationale according to the Background Art, the rationale being: the preferred technique for forming SONOS-type structures is to successively deposit oxide, nitride, oxide and polysilicon layers and then pattern the layers to form a gate electrode having underlying ONO structures via photolithography despite the tendency for varying overlap lengths to arise due to the significant tolerance associated with the photography portion of the photolithography process; and efforts to improve variations in overlap length should be directed toward reducing the alignment tolerance during the photography process. Moreover, this embodiment of the invention represents the recognition that the tolerance or variation in gate/ONO overlap length can be significantly improved (reduced) by forming the ONO structures using a technique other than the misalignment-prone photolithography technique. Even further, this embodiment of the invention represents the realization that a void underneath a gate structure can be formed of precise dimensions, and an ONO structure can be built up within that void, resulting in a uniform gate/ONO overlap length.

Figure 5:
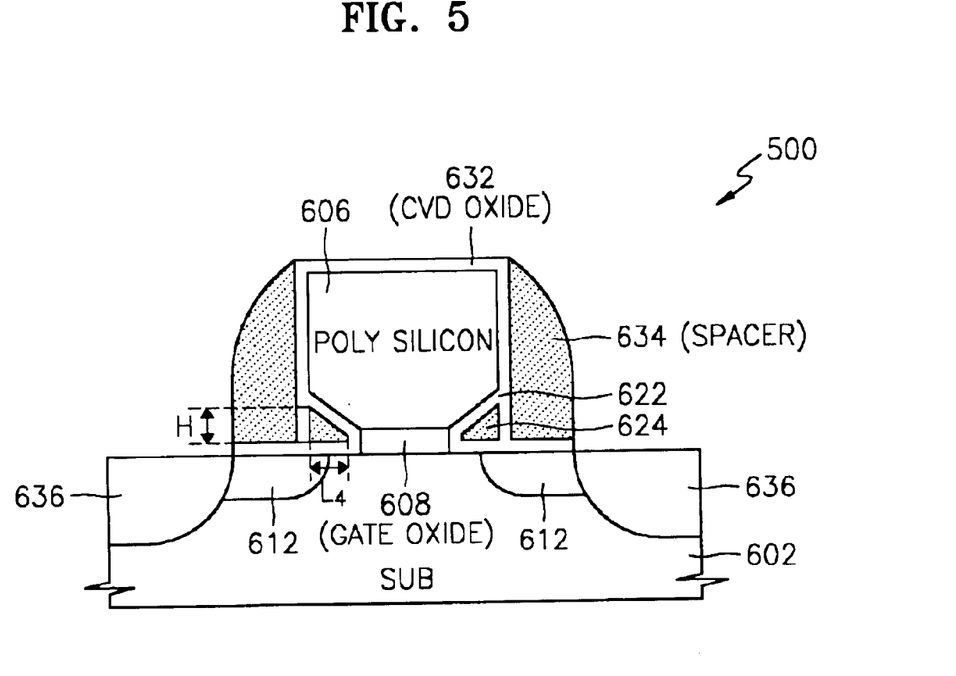
FIG. 5 is a cross-section of a local SONOS-type structure according to an embodiment of the invention.

FIG. 5 is a cross-section of a local SONOS-type structure 500, e.g., for use as a cell in a nonvolatile semiconductor memory device according to an embodiment of the invention. The structure (cell) 500 includes a semiconductor substrate, e.g., silicon, into which has been formed lightly doped drain/source (LDD) regions 612/636 having lightly doped subregions 612 and heavily doped subregions 636; a gate oxide layer 608 on substrate 602; a pocket-sandwich-configured ONO structure 622/624/622 having a wedge-shaped silhouette, the ONO structure 622/624/622 having an oxide layer 622 corresponding to the pocket of the sandwich and a nitride layer 624 corresponding to the filling of the sandwich; a semiconductor, e.g., polycrystalline or amorphous silicon, notched gate electrode 606 on the layer 608 and the oxide layer 622; an oxide layer 632 on the top and sidewalls of the notched gate electrode 606, the edges of the oxide layers 622, the edges of the nitride layer 624 and the substrate 602; and sidewall spacers 634 on and against the oxide layer 632.

An advantage of the cell 500 is that the length, L4, of overlap between the wedge-silhouetted ONO structure 622/624/622 has a much smaller variation than the local SONOS-type cells according to the Background Art. Another advantage of the local SONOS-type cell 500 is that the gate oxide layer 608 is relatively thin as contrasted with the local SONOS-type cells according to the Background Art.

Figure 6A:
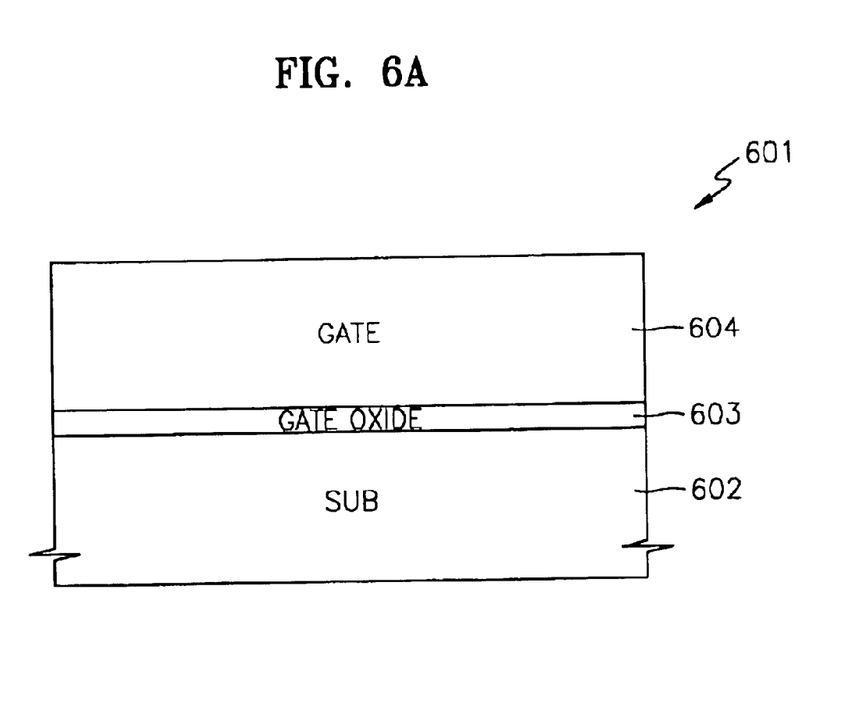
FIGS. 6A–6F are cross-sections of intermediate structures formed at various stages during a method of manufacture according to an embodiment of the invention that produces the structure of FIG. 5.

FIGS. 6A–6F are cross-sections of intermediate structures formed at different points during a method according to an embodiment of the invention of manufacturing the cell 500. In FIG. 6A, an intermediate structure 601 is produced by forming a substrate layer 602; forming a layer of gate oxide material 603 on the substrate 602; and a layer of gate electrode material 604 on the layer 603.

Figure 6B:
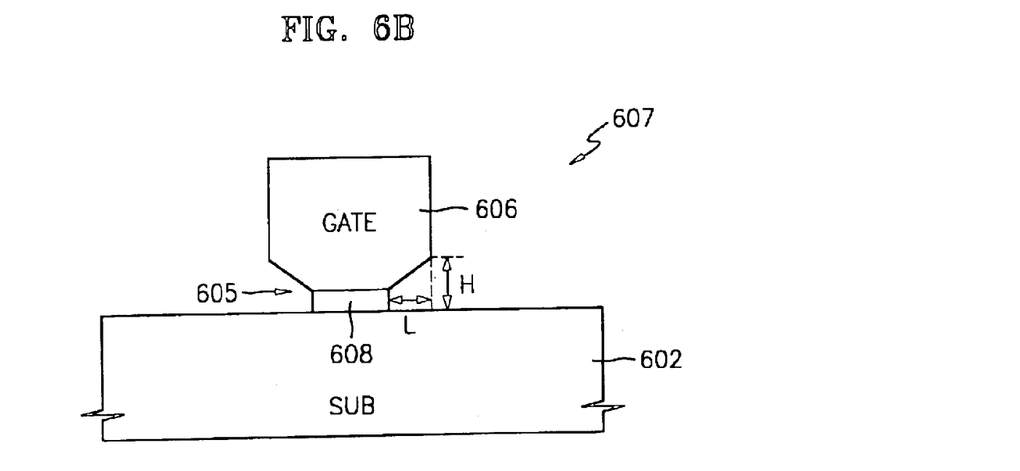

To arrive at the intermediate structure 607 of FIG. 6B, a photolithography process has already been performed on the intermediate structure 601 to define a portion of the layer 604 that will become the gate electrode 606, followed by an etching process that removes portions of the layer 604 not under the shadow of the patterned photo resist (not shown). The oxide layer 603 is not etched during the etching of the polysilicon, but is etched during a subsequent cleaning of the intermediate structure (not shown) resulting after etching of gate. The etching process can use a mixture of HBr, HeO2, N2 and CF4 gases. Such etching is a type of plasma etching that, relative to the plasma etching used to form local SONOS-type cells according to the Background Art, is relatively lower in radio-frequency (RF) power.

FIG. 5 is a cross-section of a local SONOS-type nonvolatile memory cell 500 according to an embodiment of the invention. Various intermediate structures arising during manufacture of cell 500 are depicted in FIGS. 6A–6F. The plasma etching and cleanup applied to the intermediate structure 601 of FIG. 6A results in the formation of wedge-shaped recesses 605. An explanation for the physics of such notch formation is that, as the portions of the polysilicon 604 are removed (exposing the underlying oxide layer 603), ion bombardment of the oxide layer 603 begins. Some oxygen is liberated via the ion bombardment. The lower corners of the gate electrodes 606 are in closest proximity to the liberated oxygen which interacts with the lower corners in such a way as to make them more susceptible to etching by chlorine atoms. Consequently, the lower corners of the gate electrode 606 are etched away during the etching of the oxide layer 603, whereas the other portions of the gate electrode 606 are substantially not effected, resulting in formation of the notches 605. See, e.g., *Silicon Processing for the VLSI Era*, Volume 1. S. Wolf, Lattice Press, p. 686–688. In other words, the notches 605 are formed by manipulating the over-etching conditions so that the tendency for the plasma ions to travel straight down weakens. See for example, International Patent Application, Publication No. WO 034984, the entirety of which is hereby incorporated by reference.

After the etching process, during a subsequent cleaning step, a segment 608 of the oxide layer 603 remains underneath the notched gate electrode 606 between the notches 605.

The layer of gate material 604 can be polycrystalline silicon, or a double-strata arrangement of a polycrystalline silicon layer and a SiGe layer, or a double-strata layer having a W layer below a TiN layer, or polycrystalline SiGe, or amorphous silicon.

Some example ranges for the height, H, and the length, L, of the notches 604 are as follows: about 40 nm≦L≦about 100 nm; and about 10 nm≦H≦about 30 nm. Alternatively, the height, H, can be less than about 10 nm, but charge retention begins to be negatively affected. Also alternatively, the height H can be greater than about 30 nm, but the operation voltage of the resulting local SONOS-type cell increases to less desirable magnitudes.

Figure 6C:
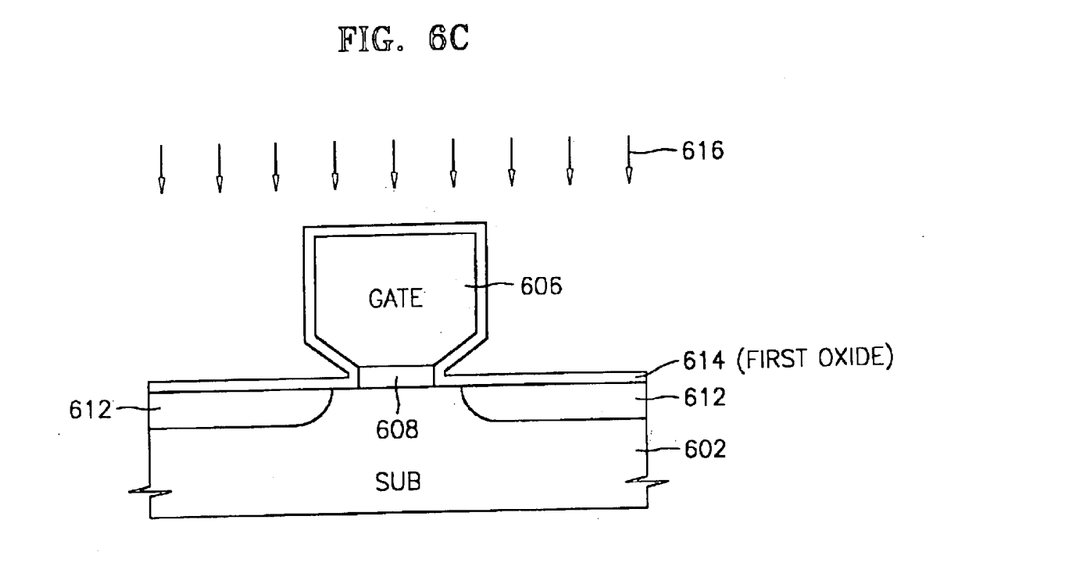

In FIG. 6C, a first oxide layer 614 is formed on the intermediate structure 607 of FIG. 6B. Then, an ion implantation process (represented by the downward-pointing arrows) is carried out to implant ions into the substrate 602, resulting in the lightly doped regions 612 of the substrate 602. The ion implantation damages the first oxide layer 614 and hence, the first oxide layer 614 is removed after the ion implantation. The thickness of the first oxide layer 614 can be in the range of about 30 Å–about 70 Å.

Figure 6D:
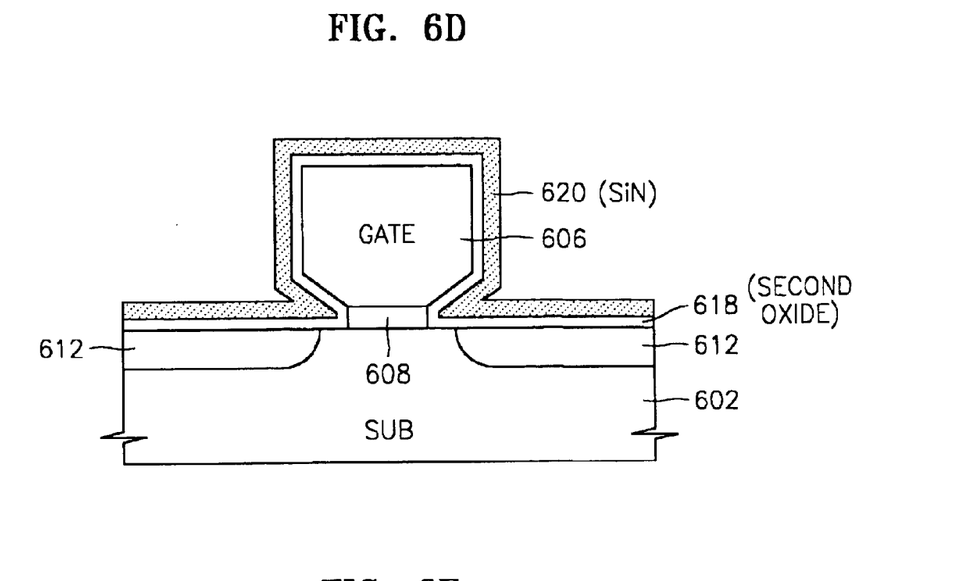

In FIG. 6D, after the first oxide layer 614 has been removed, a second oxide layer 618 is formed on the gate electrodes 606, the edges of the gate insulator 608 and the substrate 602. A thickness of the second oxide layer can be in the range of about 40 Å–about 100 Å. Next, a nitride, e.g., SiN, layer 620 is formed on the second oxide 618. A thickness of the nitride 620 can be in the range of about 100 Å–about 300 Å. The second oxide layer 618 can be formed (grown) by a thermal process, or alternatively by a deposition process. The second oxide layer 618 can be formed using a furnace or rapid thermal processing (RTP) equipment. Once the formation of the second oxide layer 618 is substantially completed, nitrogen can be added to the source gas so as to begin growth of the nitride layer 620 in a continuous fashion. Alternatively, the nitride layer 620 can be formed using chemical vapor deposition (CVD) or atomic layer deposition (ALD) equipment.

Figure 6E:
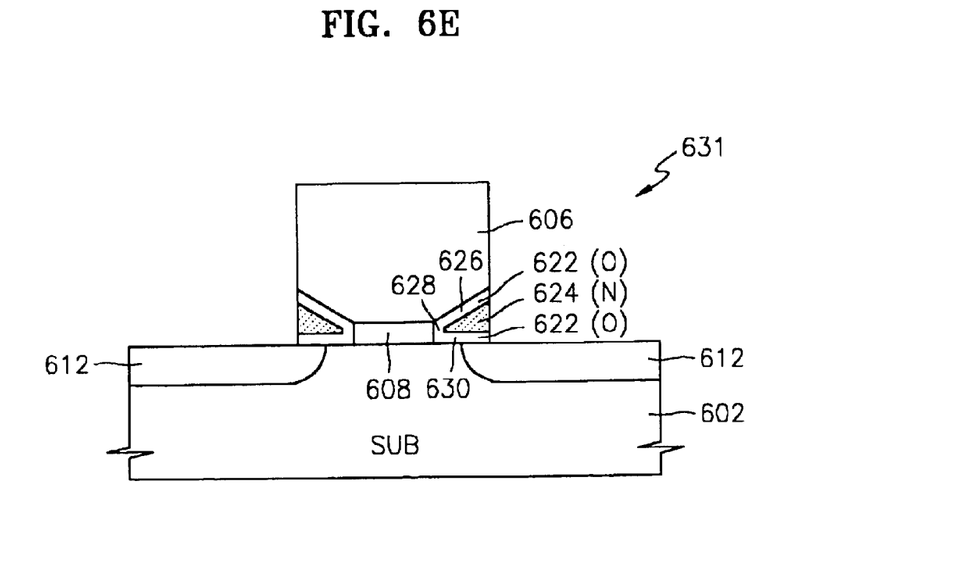

In FIG. 6E, the nitride layer 620 and the second oxide layer 618 are etched-back using, e.g., an anisotropic reactive ion etching (RIE) process or selective wet etching process. The result is a pocket-sandwiched-shaped oxide/nitride/oxide (ONO) structure 622/624/622 formed from the remaining portions 624 of the nitride layer 620 and the remaining portion 622 of the second oxide layer 618. The oxide layer 622 has an upper portion 626, a side portion 628 and a lower portion 630. The lower portion 630 functions as the tunnel oxide layer in the ONO structure 622/624/622. The upper portion 626 functions as the top oxide layer in the ONO structure 622/624/622. And the nitride layer 624 functions as the electron/hole-trapping layer in the ONO structure 622/624/622. After the layers 620 and 618 have been etched, the intermediate structure 631 is formed.

Figure 6F:
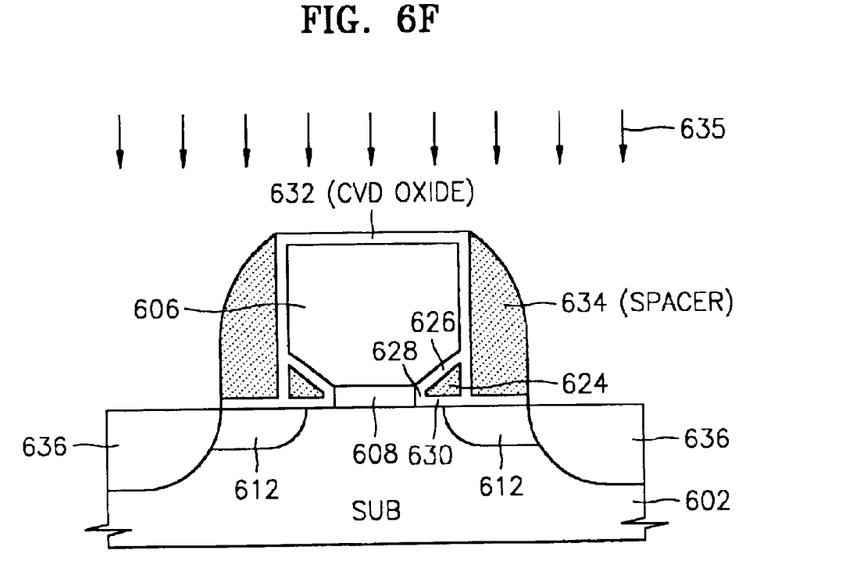

In FIG. 6F, a fourth dielectric, e.g., a CVD oxide, layer 632 is formed on the intermediate structure 631 of FIG. 6E. Then, sidewall spacers 634 are formed on the fourth dielectric layer 632, to each side of the notched gate electrode 606. After the formation of the sidewall spacer 634, another ion implantation process is performed (as indicated by the downward-pointing arrows 635), resulting in the formation of the heavily doped subregion 636 of the LDD regions 612/636 in the substrate 602. The fourth dielectric layer 632 and the material for the spacer formed on the layer 632 are etched back to form the sidewall spacers 634 using, e.g., an RIE process.

Figure 7A:
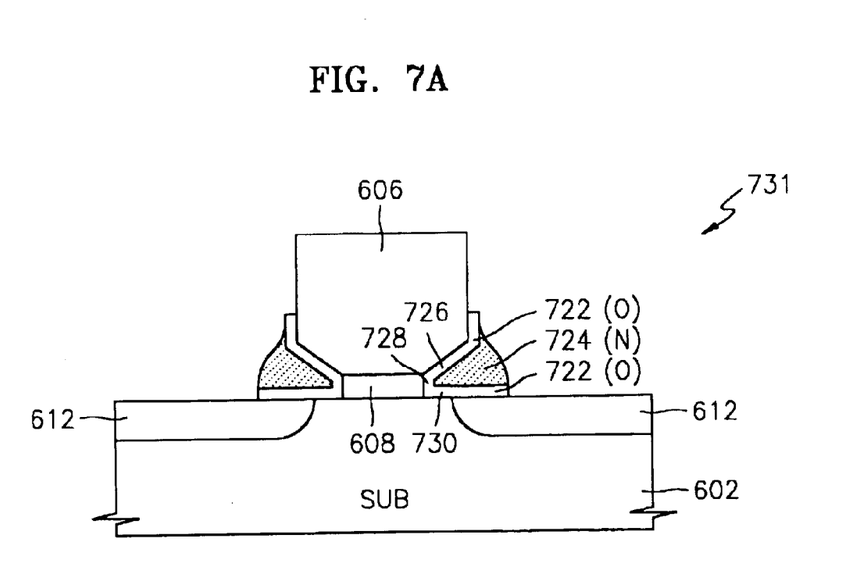
FIGS. 7A–7B are cross-sections of intermediate structures formed during a method of manufacture according to another embodiment of the invention, where FIGS. 7A–7B correspond to FIGS. 6E–6F.

By manipulating the conditions of the RIE processing (by which the nitride layer 620 and the second oxide layer 618 are removed resulting in the intermediate structure 631), the ONO structures can be made to extend beyond the sides of the notched gate electrode 606 as in the intermediate structure 731 of FIG. 7A; as such, FIG. 7A corresponds to FIG. 6E. The intermediate structure 731 includes: a substrate 602; the gate insulating layer 608; the notched gate electrode 606; and the light doped region 612 in the substrate 602. But in FIG. 7A, lesser amounts of the nitride layer 620 and the second oxide layer 618 have been removed, resulting in a remaining oxide layer segment 722 and a remaining nitride layer segment 724 that each extend asided the notched gate 606. Portions 726, 728 and 730 of the oxide layer 722 correspond to the portions 626, 628 and 630 of the oxide layer 622, respectively.

Figure 7B:
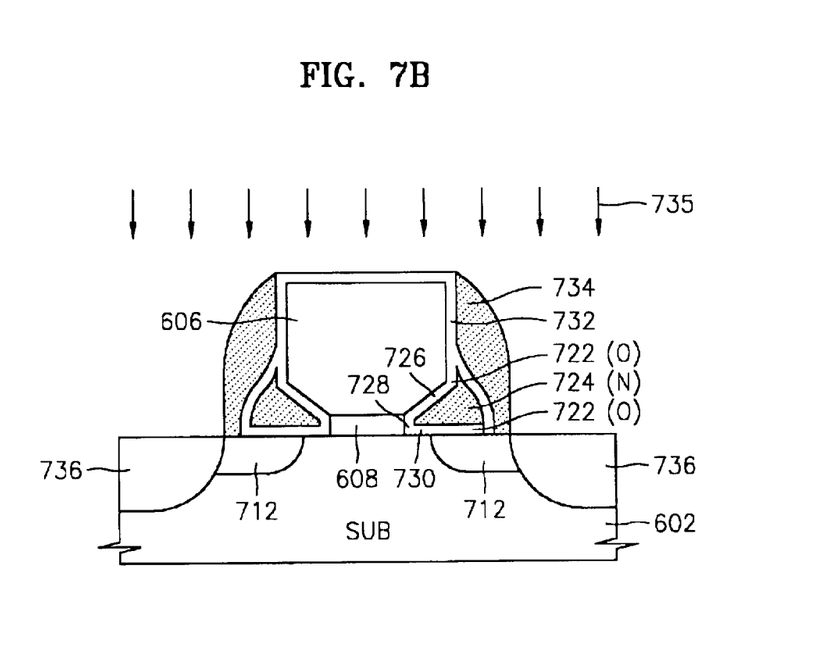

FIG. 7B corresponds to FIG. 6F. In FIG. 7B, a fourth dielectric, e.g., a CVD oxide layer, 732 has been formed corresponding to the fourth dielectric layer 632 of FIG. 6F. Then, a sidewall spacer 734 is formed corresponding to the sidewall spacer 634 of FIG. 6F. Subsequently, an ion implantation (represented by the downward-pointing arrows 735) process is performed corresponding to the ion implantation process 635 of FIG. 6F. The portion of the ONO structure 722/724/722 extending aside the notched gate electrode 606 can, as a practical matter, can help the sidewall spacer 734 to cast a shadow (in terms of ion penetration) over the substrate 602.

Figure 8:
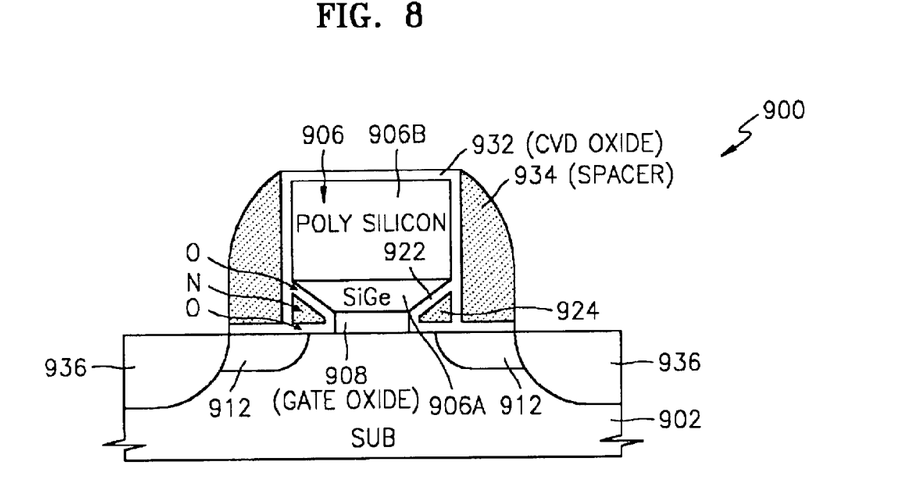
FIG. 8 is a cross-section of a local SONOS-type structure according to another embodiment of the invention.

FIG. 8 is a cross-section of a local SONOS-type structure 900, e.g., a cell for use in a nonvolatile semiconductor memory, according to another embodiment of the invention. The cell 900 corresponds to the cell 500 in many ways. The cell 900 includes the substrate 902 (corresponding to substrate 602) having LDD regions 912/936 including lightly doped subregions 912 (corresponding to subregions 612) and highly doped subregions 936 (corresponding to highly doped subregions 636); the gate oxide layer 908 (corresponding to the gate oxide layer 608) a notched gate electrode 906 corresponding to the notched gate electrode 606; a wedge-silhouetted ONO structure 922/924/922 having an oxide layer 922 (corresponding to oxide layer 622) and a nitride layer 924 (corresponding to nitride layer 624); an oxide layer 932 (corresponding to oxide layer 632); and sidewall spacer 934 (corresponding to sidewall spacer 634).

But unlike the notched gate electrode 606 of FIG. 5, the notched gate electrode 906 of FIG. 8 has two strata, namely a semiconductor, e.g., polycrystalline SiGe, layer 906A on the gate oxide 908 and the oxide layer 922, and a semiconductor, e.g., polycrystalline silicon, layer 906B on the layer 906A.

The notched gate 906 is formed by stacking two conductive layers 906A and 906B, which are (in-part) selected on the basis of having different etch selectivities from each other, the notches being the result of the different etch selectivities. For example, where layer 906B is poly-Si and layer 906A is poly-SiGe, a known chemical wet etching process, which has an etch selectivity of poly-Si with respect to poly-SiGe, can be used. As another example, using an etchant which is a mixed solution of ammonium hydroxide (NH$_4$OH), peroxide (H$_2$O$_2$), and water (H$_2$O) with a volume ratio of about 1:1:5, where Ge accounts for 40% of poly Si(1-x)Ge(x), an isotropic etching process can exhibit etch selectivity of poly-SiGe with respect to poly-Si of about 33:1. Under the same etching conditions, the etch selectivity of a SiGe polycrystalline layer to SiO2 is 100:1. See "Selective Removal of Silicon Germanium: Chemical and Reactive Ion Etching", p. 157–162, Material Research Society Symposium of Proceedings, Vol. 298, 1993, the entirety of which is hereby incorporated by reference.

Another method of selectively etching poly-SiGe is a chemical etching process using plasma, in which the etch selectivity of SiGe to Si is maintained at 100:1. See "Well-controlled, Selectively Under-etched Si/SiGe Gates for RF and High Performance CMOS, p. 156, 2000 Symposium on VLSI Technology Digest of Technical Papers", the entirety of which is hereby incorporated by reference. Alternatively, an atomic layer etching method can be used to selectively etch poly-SiGe with respect to poly-Si. The aforementioned etching methods may be performed individually or together.

The lower gate layer 906A can have a thickness of a range of about 100 Å–about 300 Å. The etchant for removing portions of the oxide layer 903, a conductive layer 909 (see FIG. 9A, from which leyer 906A is formed) and the conductive layer 904 can be a mixture of NH$_4$, H$_2$O$_2$, and H$_2$. The height and length ranges for the wedge-shaped recesses 905 can be the same as for the recesses 605. An example combination of sizes would be a lower conductive layer portion having a thickness of about 150 Å, with the recesses 905 having a length of about 600 Å and a height of about 250 Å.

The second dielectric layer 918 can have a thickness in the range of about 40 Å–about 100 Å. The thickness of the nitride layer 920 can be the same as the thickness of the nitride layer 620.

FIGS. 9A–9E are cross-sectional views of intermediate structures formed at different points during a method according to an embodiment of the invention of manufacturing the cell 900.

Figure 9A:
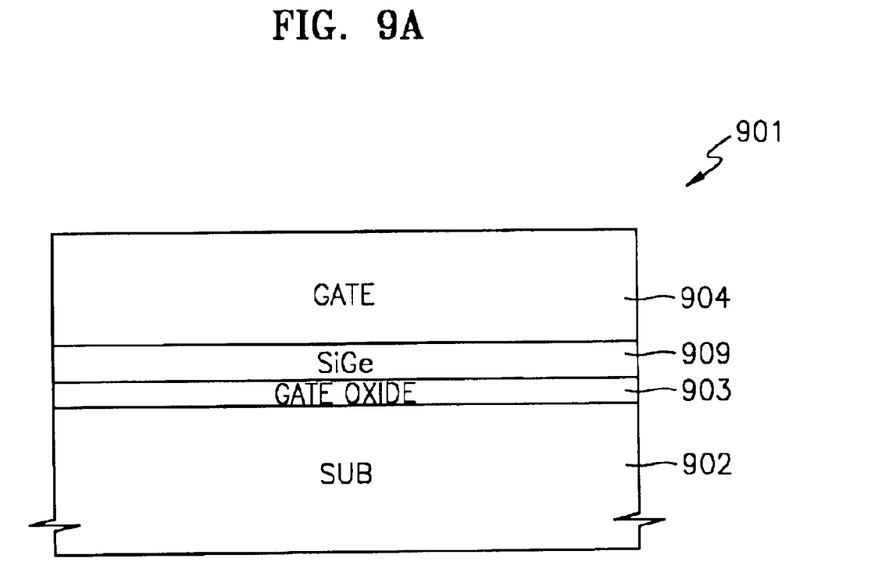
FIGS. 9A–9E are cross-sections of intermediate structures formed at various stages during a method of manufacture according to an embodiment of the invention that produces the structure of FIG. 8.
Figure 9B:
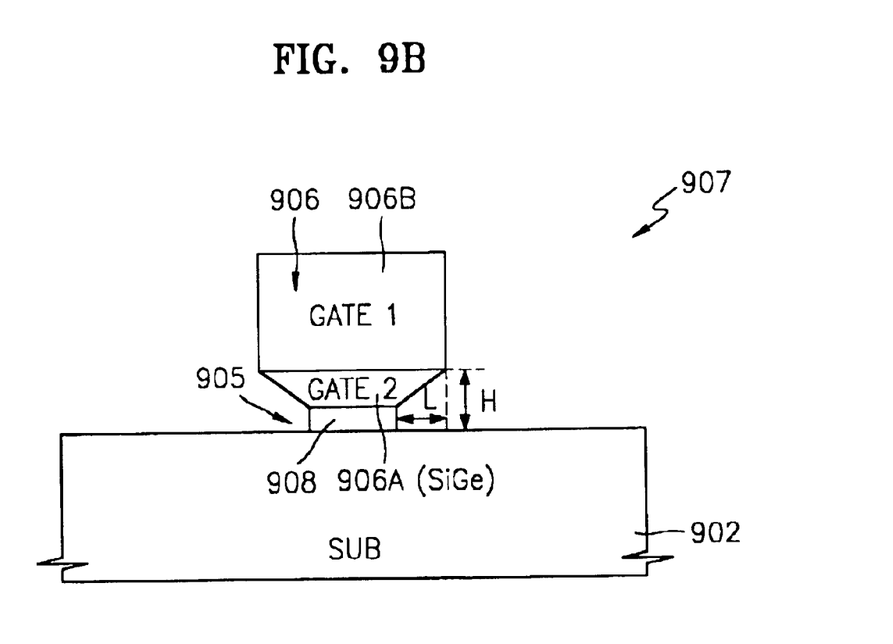
Figure 9C:
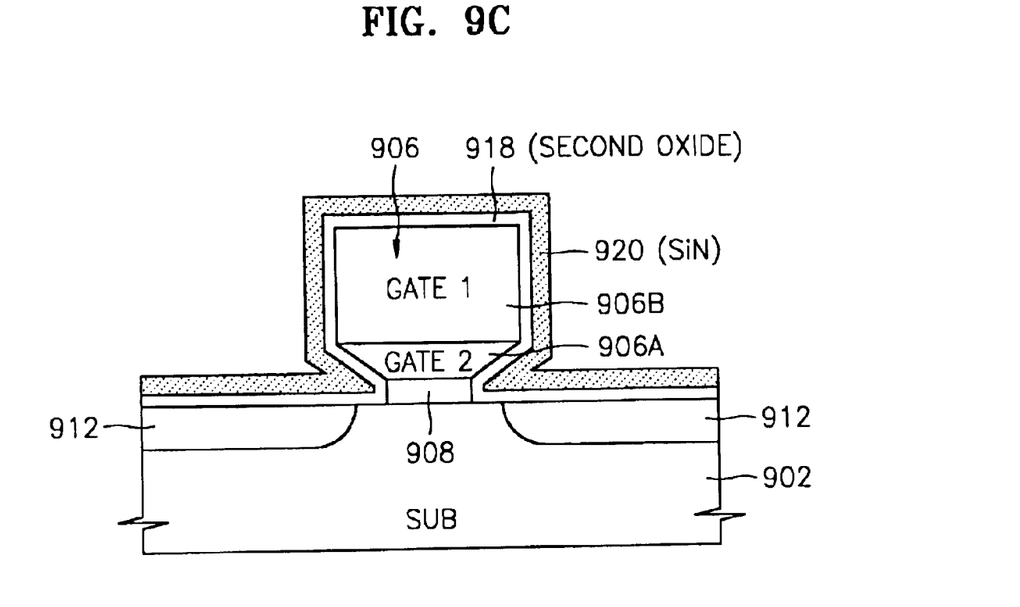
Figure 9D:
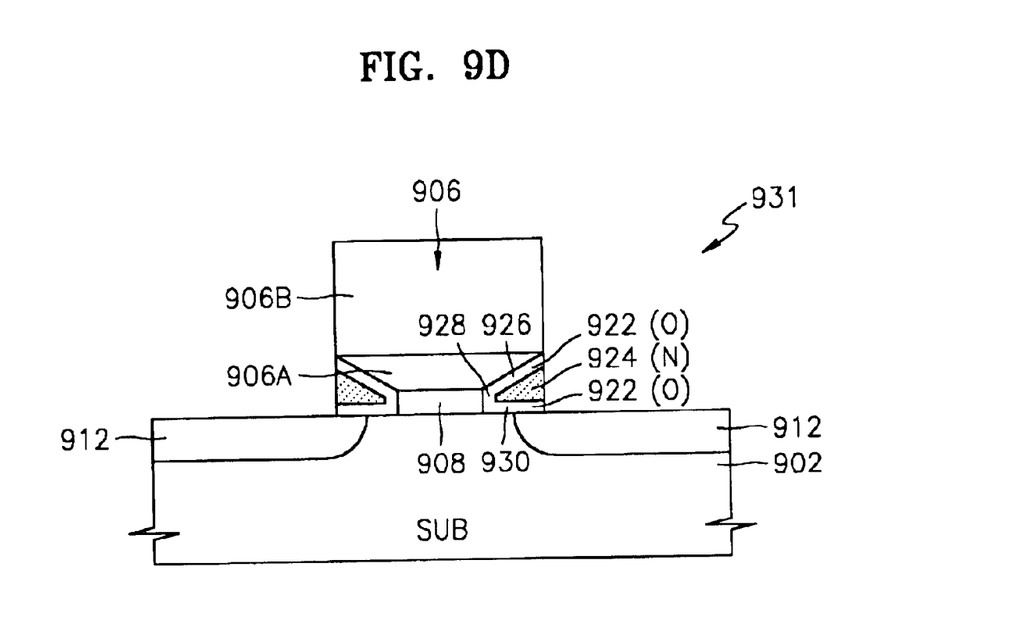
Figure 9E:
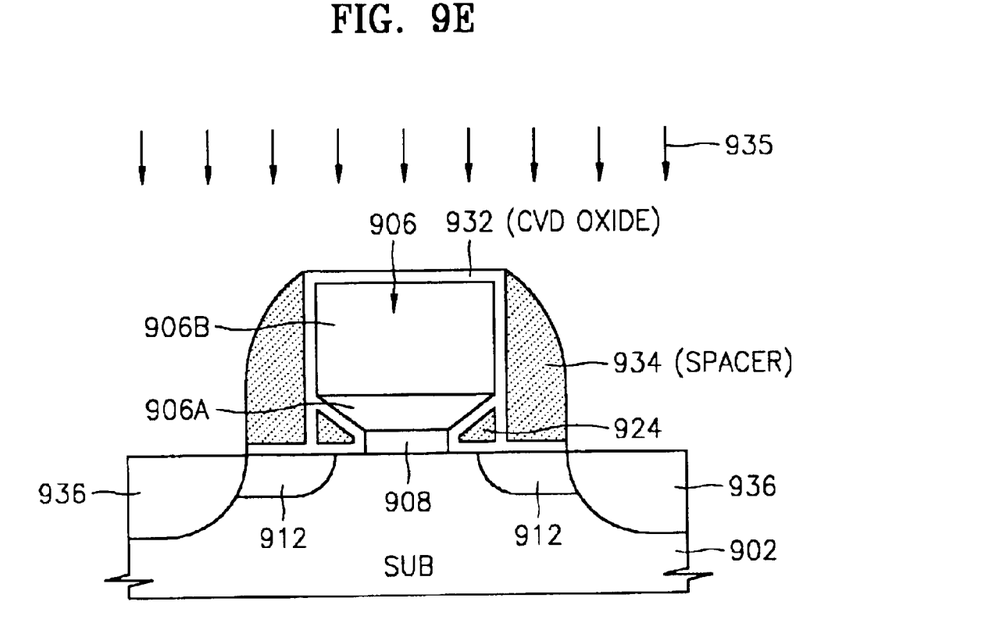

FIG. 9A substantially corresponds to FIG. 6A. FIG. 9B substantially corresponds to FIG. 6B. FIG. 9C corresponds to FIG. 6D. FIG. 9D corresponds to FIG. 6E. FIG. 9E corresponds to FIG. 6F. For simplicity, the series 9 figures do not include a figure that corresponds to FIG. 6C.

In FIG. 9A, an intermediate structure 901 is produced by forming a substrate layer 902; a conductive layer, e.g., poly-SiGe, on the layer 903; forming a layer of gate oxide material 903 on the substrate 902; and forming a layer 904 of gate electrode material on the layer 909. As an alternative to layer 909 being poly-SiGe, tungsten can be used; and TiN can be used for layer 904 instead of poly-Si.

In FIG. 9B, a photolithography process has been performed on the intermediate structure 901 to define a portion of the layer 904 that will become the gate electrode 906, followed by an etching process that removes portions of the layers 904 and 909 not underneath the shadow of the patterned photoresist (not depicted). The layer 903 is not affected during the etching of the layers 904 and 909. In a subsequent cleaning step, portions of the gate oxide layer 903 are removed. The plasma etching and cleanup applied to the intermediate structure 901 results in the formation of wedge-shaped recess 905. The etching process can use a mixture of HeO2, N2 and CF4 gases. Again, such etching is a type of plasma etching that, relative to the plasma etching used to form local SONOS-type cells according to the Background Art, is relatively lower in radio-frequency (RF) power. After the etching process, during cleaning step a segment 908 of the oxide layer 903 remains underneath the notched gate electrode 906 between the notches 905.

Some example ranges for the height, H, and the length, L, of the notches 904 are as follows: about 40 nm $\leq$L $\leq$about 100 nm; and about 10 nm$\leq$H$\leq$about 30 nm. Alternatively, the height, H, can be less than about 10 nm, but charge retention begins to be negatively affected. Also alternatively, the height H can be greater than about 30 nm, but the operation voltage of the resulting local SONOS-type cell increases to less desirable magnitudes.

Before getting to the intermediate stage corresponding to FIG. 9C, a first oxide layer (not shown) is formed on the intermediate structure 907 of FIG. 9B. Then, ions are implanted (not shown) into the substrate 902 resulting in the lightly doped regions 912 of the substrate 902. And then the first oxide layer 914 is removed. The first oxide layer 914 can be in the range of about 30 Å–about 70 Å.

In FIG. 9C, after the first oxide layer (again, not shown) has been removed, a second oxide layer 918 is formed on the gate electrodes 906, the edges of the gate insulator 908 and the substrate 902. A thickness of the second oxide layer can be in the range of about 40 Å–about 100 Å. Next, a nitride, e.g., SiN, layer 920 is formed on the second oxide 918. A thickness of the nitride 920 can be in the range of about 100 Å–about 300 Å. The second oxide layer 918 can be formed (grown) by a thermal process, or alternatively by a deposition process. The second oxide layer 918 can be formed using a furnace or rapid thermal processing (RTP) equipment. Once the formation of the second oxide layer 918 is substantially completed, nitrogen can be added to the source gas so as to begin growth of the nitride layer 920 in a continuous fashion. Alternatively, the nitride layer 920 can be formed using chemical vapor deposition (CVD) or atomic layer deposition (ALD) equipment.

In FIG. 9D, the nitride layer 920 and the second oxide layer 918 are etched-back using, e.g., an anisotropic reactive ion etching (RIE) process or selective wet etching process. The result is a pocket-sandwiched-shaped oxide/nitride/oxide (ONO) structure 922/924/922 formed from the remaining portions 924 of the nitride layer 920 and the remaining portion 922 of the second oxide layer 918. The oxide layer 922 has an upper portion 926, a side portion 928 and a lower portion 930. The lower portion 930 functions as the tunnel oxide layer in the ONO structure 922/9241922. The upper portion 926 functions as the top oxide layer in the ONO structure 922/924/922. And the nitride layer 924 functions as the electron/hole-trapping layer in the ONO structure 922/924/922. After the layers 920 and 918 have been etched, the intermediate structure 931 is formed.

In FIG. 9E, a fourth dielectric e.g., a CVD oxide, layer 932 is formed on the intermediate structure 931 of FIG. 9E. Then, sidewall spacers 934 are formed on the fourth dielectric layer 932, to each side of the notched gate electrode 906. After the formation of the sidewall spacer 934, another ion implantation process is performed (as indicated by the downward-pointing arrows 935), resulting in the formation of the heavily doped subregion 936 of the LDD regions 912/936 in the substrate 902. The fourth dielectric layer 932 and the material for the spacer formed on the layer 932 are etched back to form the sidewall spacers 934 using, e.g., an RIE process.

Figure 10A:
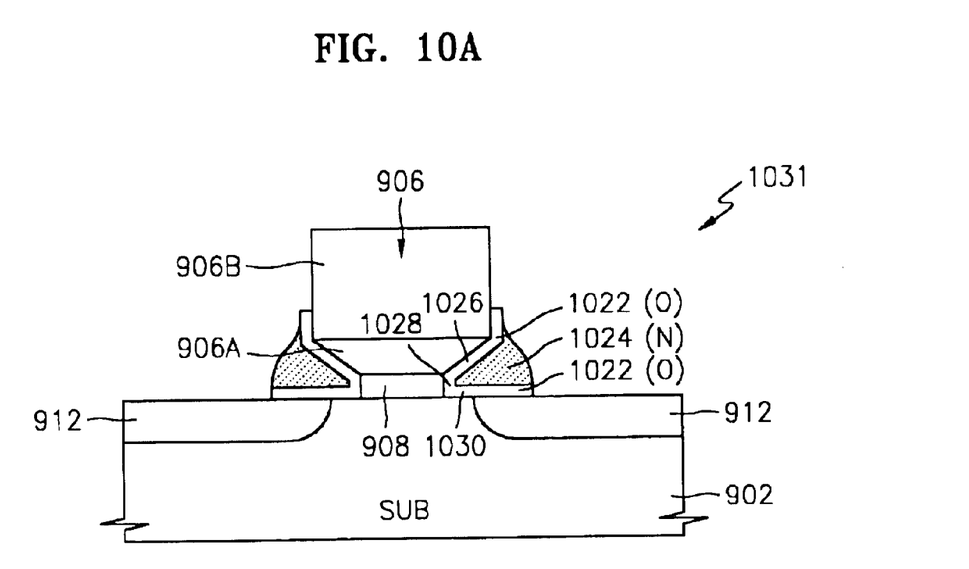
FIGS. 10A–10B are cross-sections of intermediate structures formed during a method of manufacture according to another embodiment of the invention, where FIGS. 10A–10B corresponds to FIG. 9E.

By manipulating the conditions of the RIE processing (by which the nitride layer 920 and the second oxide layer 918 are removed resulting in the intermediate structure 931), the ONO structures can be made to extend beyond the sides of the notched gate electrode 906 as in the intermediate structure 1031 of FIG. 10A as such, FIG. 10A corresponds to FIG. 9D. The intermediate structure 1031 includes: a substrate 902; the gate insulating layer 908; the notched gate electrode 906; and the light doped region 912 in the substrate 902. But in FIG. 10A, lesser amounts of the nitride layer 920 and the second oxide layer 918 have been removed, resulting in a remaining oxide layer segment 1022 and a remaining nitride layer segment 1024 that each extend aside the notched gate 906. Portions 1026, 1028 and 1030 of the oxide layer 1022 correspond to the portions 926, 928 and 930 of the oxide layer 922, respectively.

Figure 10B:
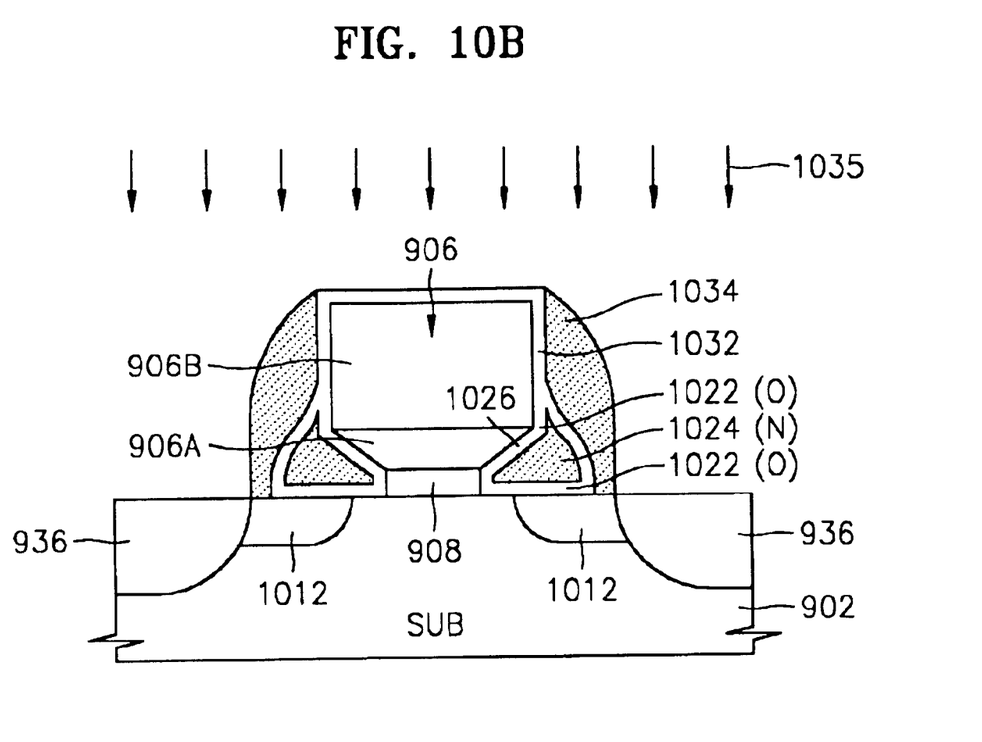

FIG. 10B corresponds to FIG. 9F. In FIG. 10B, a fourth dielectric, e.g., a CVD oxide, layer 1032 has been formed corresponding to the fourth dielectric layer 932 of FIG. 9F. Then, a sidewall spacer 1034 is formed corresponding to the sidewall spacer 934 of FIG. 9F. Subsequently, an ion implantation (represented by the downward-pointing arrows 1035) is performed corresponding to the ion implantation process 935 of FIG. 9F. The portion of the ONO structure 1022/1024/1022 extending aside the notched gate electrode 906 can, as a practical matter, can help the sidewall spacer 1034 to cast a shadow (in terms of ion penetration) over the substrate 902.

As an example of specific layer thickness, the layer 903 (from which the gate oxide layer 908 will be formed) and the layer 909 (from which the lower gate electrode portion 906A will be formed), e.g., a PVD TiN film, are sequentially deposited to have a thickness of 3.5 nm and a thickness of 35 nm, respectively, and then the layer 904 (from which the upper gate electrod 906B will be formed) e.g., a tungsten film, of a thickness of 80 nm is deposited thereon using, e.g., CVD. The tungsten layer 904 and the TiN layer 909 are etched individually. In other words, the tungsten layer 904 is etched using, e.g., a reactive ion etching (RIE) method, and then the TiN layer 909 is etched, using. e.g., a wet etching method having a high etch selectivity with respect to a tungsten layer 904 and the oxide layer 903. See "A Notched Metal Gate MOSFET for Sub-0.1 nm Operation, p. 659–662, 2000 IEDM", the entirety of which is hereby incorporated by reference.

It is possible to adjust the height (H) of notch 905 depending on the thickness of the lower portion 906A of the gate electrode 906 SiGe layer or the TiN layer. Since the height (H) of a notch 905 considerably affects the initial threshold voltage Vth, the programming voltage, speed, and retention characteristics, better results can be obtained when the notch 905 is of a height (H) of no greater than about 300 Å; but it is noted that the height (H) of the notch 905 can be greater than 300 Å according to other embodiments of SONOS-type structures of the invention. However, to facilite a SONOS-type cell according to embodiments of the invention exhibiting an initial voltage of about 1.0–about 1.5 V, low programming voltage, high programming speed, and data retention time of more than about 10 years, the notches 905 should be formed as thinly as possible, i.e., should have a height (H) as small as is practical. The height (H) and length (L) of the notch 905 are determined at the same time during the formation of the notches 905. So it should be noted (as a practical matter because of the need for the notch 905 to have some length) that there is (in effect), a limit upon how much the height (H) of the notches 905 can be reduced.

As an example of specific dimensions, suppose that the length of a notched gate is about 250 nm–300 nm, then the notch 905 can have a length of about 60 nm–about 70 nm, which is slightly smaller than about one-fourth of the length (L) of the notched gate electrode 906, e.g., to help suppress the problem of endurance deterioration caused by movement of electrons. However, if a design rule decreases, the length of an ONO structure need not be proportional to the length of a gate. In terms of the state of current techniques, better results (for the programming operation of a cell) can be obtained if the ONO structure has a length of at least about 60 nm; similarly if the length (L) of the notched gate electrode 906 is decreased to be no greater than about 200 nm, the length of an ONO structure can account for up to half of the length of the noted gate electrode 906.

The present invention and exemplary embodiments thereof are described more fully with reference to the accompanying drawings. This invention may, however, be embodied in many different forms and should not be construed as being limited to the exemplary embodiments set forth herein; rather these exemplary embodiments are provided so that this disclosure is thorough and complete, and conveys the concept of the invention to those skilled in the art. In the drawings, the thickness of layers and regions are exaggerated for clarity. When a layer is referred to as being "on" another layer or substrate, the layer may be directly on the other layer or substrate, or intervening layer may also be present.

What is claimed:

1. A notched gate SONOS transistor comprising:
   a substrate having source/drain regions;
   a gate insulator layer on the substrate between the source/drain regions;
   a notched gate structure, on the gate insulator layer, having at least one notch; and
   at least one ONO wedge structure in the at least one notch, respectively, of the gate structure.

2. The transistor of claim 1, wherein surfaces of each notch include a portion of the substrate surface, a portion of the side edge surface of the gate insulator and a portion of the gate structure surface.

3. The transistor of claim 2, wherein the ONO wedge structure includes:
   an oxide layer that makes direct contact with the substrate surface in the notch, the side edge surface of the gate insulator layer in the notch and the gate structure surface in the notch; and
   a nitride layer formed against the oxide layer.

4. The transistor of claim 1, wherein the ONO wedge structure has a truncated-triangular shape.

5. The transistor of claim 1, wherein the gate structure includes a first conductive layer on the gate insulator layer and a second conductive layer above the first conductive layer.

6. The transistor of claim 5, wherein the at least one notch is formed into at least the first conductive layer.

7. The transistor of claim 6, wherein the at least one notch is formed into both of the first and second conductive layers, a majority of the notch being formed in the first conductive layer.

8. The transistor of claim 5, wherein the first conductive layer is formed of a material more easily etched than the second conductive layer.

9. The transistor of claim 5, wherein the first conductive layer and the second conductive layer are formed of one of the following arrangements:
   the first conductive layer includes at least two semiconductor materials and the second conductive layer has one semiconductor material; and
   the first conductive layer is a first conductor material and the second conductive layer is a second conductor material different than the first conductor material.

10. The transistor of claim 1, wherein
    the notched gate structure has at least two notches; and
    the transistor comprises at least two ONO wedge structures in the at least two notches, respectively.

11. A method of making a notched gate arrangement for a SONOS transistor, the method comprising:
    providing a substrate;
    forming a gate insulator layer on the substrate;
    forming a notched gate structure, on the gate insulator layer, having at least one notch; and
    forming at least one ONO wedge structure in the at least one notch, respectively, of the gate structure.

12. The method of claim 11, wherein the forming of the notched gate structure includes
    forming a gate conductor layer on the gate insulator layer;
    removing parts of the gate insulator layer and the gate conductor layer so as to define at least one notch, surfaces of each notch including a portion of the substrate surface, a portion of the side edge surface of the gate insulator and a portion of the gate structure surface.

13. The method of claim 12, wherein the forming of the at least one ONO wedge structure includes:
    forming an oxide layer that makes direct contact with the substrate surface in the notch, the side edge surface of the gate insulator layer in the notch and the gate structure surface in the notch; and
    forming a nitride layer against the oxide layer.

14. The method of claim 11, wherein the ONO wedge structure has a truncated-triangular shape.

15. The method of claim 11, wherein the forming of the notched gate structure includes:
    forming a first conductive layer on the gate insulator layer; and
    forming a second conductive layer above the first conductive layer.

16. The method of claim 15, wherein the forming of the notched gate structure locates the at least one notch in at least the first conductive layer.

17. The method of claim 16, wherein the forming of the notched gate structure locates the at least one notch in both of the first and second conductive layers, a majority of the notch being located in the first conductive layer.

18. The method of claim 15, wherein the forming of the notched gate structure includes
    using a material for the first conductive layer that is more easily etched than a material used for the second conductive layer.

19. The method of claim 15, wherein the forming of the first and second conductive layers includes one of the following:
    using at least two semiconductor materials for the first conductive layer and one semiconductor material for the second conductive layer; and
    or material for the first conductive layer and a conductor material different than the first conductor material for the second conductive layer.

20. The method of claim 11, wherein
    the notched gate structure has at least two notches; and
    the method comprises at least two ONO wedge structures in the at least two notches, respectively.

* * * * *